United States Patent
Reiss et al.

(10) Patent No.: US 9,503,673 B2
(45) Date of Patent: Nov. 22, 2016

(54) MICROMECHANICAL COMPONENT INCLUDING AN INTEGRATED PHOTODIODE AND A MICROPROJECTOR

(71) Applicant: Robert Bosch GmbH, Stuttgart (DE)

(72) Inventors: Sebastian Reiss, Reutlingen (DE); Frederic Njikam Njimonzie, Reutlingen (DE); Andreas Duell, Stuttgart (DE); Frank Fischer, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/513,440

(22) Filed: Oct. 14, 2014

(65) Prior Publication Data

US 2015/0103321 A1    Apr. 16, 2015

(30) Foreign Application Priority Data

Oct. 15, 2013    (DE) .......................... 10 2013 220 787

(51) Int. Cl.

| | |
|---|---|
| *H04N 5/74* | (2006.01) |
| *G02B 26/08* | (2006.01) |
| *H01L 31/0232* | (2014.01) |
| *H04N 9/31* | (2006.01) |
| *B41J 2/47* | (2006.01) |
| *H04N 1/04* | (2006.01) |
| *B41J 2/44* | (2006.01) |

(52) U.S. Cl.

CPC ............ *H04N 5/7458* (2013.01); *B41J 2/442* (2013.01); *B41J 2/473* (2013.01); *G02B 26/0833* (2013.01); *H01L 31/02325* (2013.01); *H04N 1/04* (2013.01); *H04N 9/3129* (2013.01); *H04N 9/3182* (2013.01); *H04N 9/3194* (2013.01)

(58) Field of Classification Search

CPC ..................... G02B 26/0833; H01L 31/02325; H04N 1/04; H04N 9/3129; H04N 9/3182; H04N 9/3194

See application file for complete search history.

(56) References Cited

U.S. PATENT DOCUMENTS

| | | | | |
|---|---|---|---|---|
| 6,072,817 A | * | 6/2000 | Adachi | .................. B82Y 20/00 372/45.013 |
| 6,789,959 B1 | * | 9/2004 | Conn | .................. G02B 6/3897 385/100 |
| 7,428,995 B1 | * | 9/2008 | Stern | .................. G06K 7/10742 235/462.01 |
| 2007/0252806 A1 | | 11/2007 | Kwon et al. | |
| 2009/0160833 A1 | * | 6/2009 | Brown | ..................... G09G 3/02 345/207 |

\* cited by examiner

*Primary Examiner* — Sultan Chowdhury
*Assistant Examiner* — Magda Cruz
(74) *Attorney, Agent, or Firm* — Norton Rose Fulbright US LLP; Gerard Messina

(57) ABSTRACT

A micromechanical component includes: at least one micromirror; and an integrated photodiode. The micromechanical component is part of a microprojector which further includes a light source. The integrated photodiode of the micromechanical component receives light from the light source.

8 Claims, 2 Drawing Sheets

MICROMECHANICAL COMPONENT INCLUDING AN INTEGRATED PHOTODIODE AND A MICROPROJECTOR

BACKGROUND OF THE INVENTION

1. Field of the Invention

The present invention is directed to a micromechanical component including at least one micromirror, and to a microprojector including a light source and a micromechanical component which includes at least one micromirror.

2. Description of the Related Art

Laser diodes are used in connection with scanning micromechanical mirrors for image generation in pico projectors and laser printers. In order to cover a large color spectrum, red, green, and blue diodes are generally used. The optical output power emitted at a given drive current is influenced by the diode temperature and aging effects. These effects may vary considerably for different diodes; therefore, the color obtained may differ significantly from the intended color. It is possible to compensate for these effects by controlling the diode drive current as a function of the signal of a photodetector which monitors the optical output power.

In one implementation presently used in laser scanners and laser printers, each laser diode is monitored by an individual detector, typically a photodiode. Using physical separation, it is possible to ensure that each detector is illuminated by only one laser diode. Alternatively, color filters or wavelength-sensitive detectors may be used, which are positioned as an individual component either in the laser module or at another suitable place in the scanner module.

All aforementioned devices in the related art have in common the fact that additional elements are used as detectors, resulting in additional costs and requiring additional installation space.

U.S. Patent application publication US2007/0252806 describes a circuit including three laser diodes and drivers, as well as a photodiode for monitoring and controlling the light intensity.

U.S. Patent application publication US2009/0160833 describes a laser projector including three laser diodes, three beam splitters, and three photodiodes, as well as a mirror in a discrete configuration.

BRIEF SUMMARY OF THE INVENTION

The present invention is directed to a micromechanical component including at least one micromirror. The core of the present invention is that the micromechanical component includes an integrated photodiode. In many cases, optical assemblies require a light detector. Advantageously, it is possible to integrate the photodiode into the micromechanical component in a technically simple manner and thus to provide a light detector without large additional costs. Advantageously, available installation space in the micromechanical component is used in any case.

One advantageous embodiment of the micromechanical component according to the present invention provides that the micromirror and the integrated photodiode are situated on a shared substrate. As a result, the micromirror and the photodiode may advantageously be fabricated in a shared manufacturing process. As a result, the micromirror and the photodiode advantageously have a fixed spatial relationship and alignment to each other, which is particularly important for optical devices and components in their optical path.

One advantageous embodiment of the micromechanical component according to the present invention provides that one mirror face of the micromirror is situated on a first substrate side and that a photodiode is situated on the first substrate side in such a way that the micromirror and the photodiode are situated within a shared incidence area for incident light. Advantageously, such a device makes it possible to determine the light power which is incident on the mirror in a particularly simple and reliable manner.

Another advantageous embodiment of the micromechanical component according to the present invention provides that one mirror face of the micromirror is situated on a first substrate side, a cap is situated on a second substrate side, the second substrate side being situated opposite to the first substrate side, and a photodiode on the second substrate side is situated in an area covered by the cap, in such a way that the micromirror and the cap are situated within a shared incidence area for incident light and that the photodiode is configured for receiving scattered light which emanates from the cap. As a result, it is advantageously possible to arrange the photodiode in a particularly space-saving manner, for example, without limiting the installation space for the micromirror.

One advantageous embodiment of the micromechanical component according to the present invention provides that the substrate has a contacting plane and the photodiode is situated in the contacting plane or in an adjacent plane. Thus, the integrated photodiode is advantageously able to be electrically contacted simply and economically.

It is also advantageous that the substrate has at least one doped semiconductor layer and the photodiode is situated in the doped semiconductor layer. The photodiode may advantageously be integrated into the micromechanical component without additional processes or with few additional manufacturing steps. The substrate is particularly advantageously a silicon substrate, or the substrate is a multilayer substrate and has at least one silicon layer. It is advantageous that established silicon semiconductor technology processes may be used for manufacturing the micromechanical component and in particular the integrated photodiode.

The present invention is also directed to a microprojector including a light source and including a micromechanical component which includes at least one micromirror. The core of the present invention is that the micromechanical component includes an integrated photodiode for receiving light from the light source.

Advantageously, the microprojector may thus be equipped with a photodiode without requiring appreciable additional installation space.

One advantageous embodiment of the microprojector according to the present invention provides that the light source is a laser light source, in particular including a semiconductor laser medium. The power of a laser light source may advantageously be controlled with the aid of a control current based on the light intensity measurement with the aid of a photodiode.

One particularly advantageous embodiment of the microprojector according to the present invention provides that the laser light source has at least a first laser wavelength and at least a second laser wavelength, and the optical paths of the emitted light of the first laser wavelength and the second laser wavelength are at least partially overlapping. Power measurements for multiple laser wavelengths may advantageously be carried out using one photodiode, since the light sensitivity of the photodiode is relatively broadband and since the same photodiode may be irradiated with light using overlapping optical paths without additional expense.

It is also advantageous that the laser light source includes at least a first laser having a first laser wavelength and at least a second laser having a second laser wavelength. Another advantageous embodiment provides that the laser light source has a laser which emits light having a first and a second wavelength.

The present invention enables the monitoring of the optical output power of one or multiple laser diodes using one photodiode in order to compensate for temperature and aging effects. By integrating the photodiode into a micromechanical module (MEMS) acting as a scanner, the placement of one or multiple additional components is avoided, so that it is possible to save on installation space and costs in the overall system.

The manufacturing process for micromirrors in the form of micromechanical modules (MEMS) for scanning optical applications such as laser scanners or laser projectors also allows the manufacture of photodiodes as an integral part of the MEMS. By suitably selecting the process sequence and positioning of the photodiode in the MEMS, it is possible to reduce the required installation space and costs. In the ideal case, the photodiode may be integrated in a manner which is neutral with respect to costs and installation space.

In order to monitor the optical output power correctly, it must be ensured that the photodiode is sufficiently well illuminated. In one preferred specific embodiment of the present invention, scattered light from the edge area of the primary beam is used for this purpose inside the MEMS. In another preferred specific embodiment, the light is detected directly from the primary beam.

DETAILED DESCRIPTION OF THE INVENTION

Figure 1:
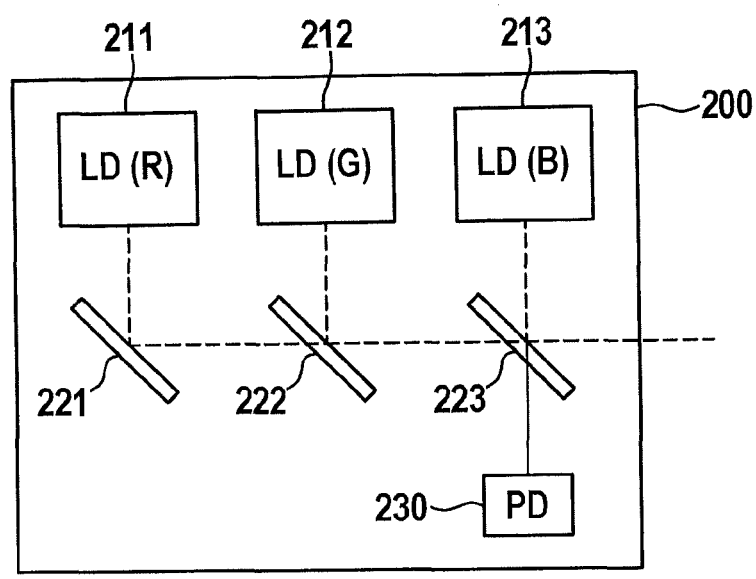
FIG. 1 shows a laser light source in the related art including three lasers and one photodiode.

FIG. 1 shows a laser light source in the related art including three lasers and one photodiode. A laser module 200 is depicted having monitoring of three laser diodes 211, 212, and 213 using a photodiode 230. Three laser beams are combined into one beam with the aid of beam splitters 221, 222, 223. A portion of the combined beam is directed onto photodiode 230, which is also situated inside laser module 200. Photodiode 230 is used as a shared detector for the radiant power of all three laser diodes. This detector may typically be implemented using color filters for selectively monitoring the individual laser diodes.

Figure 2:
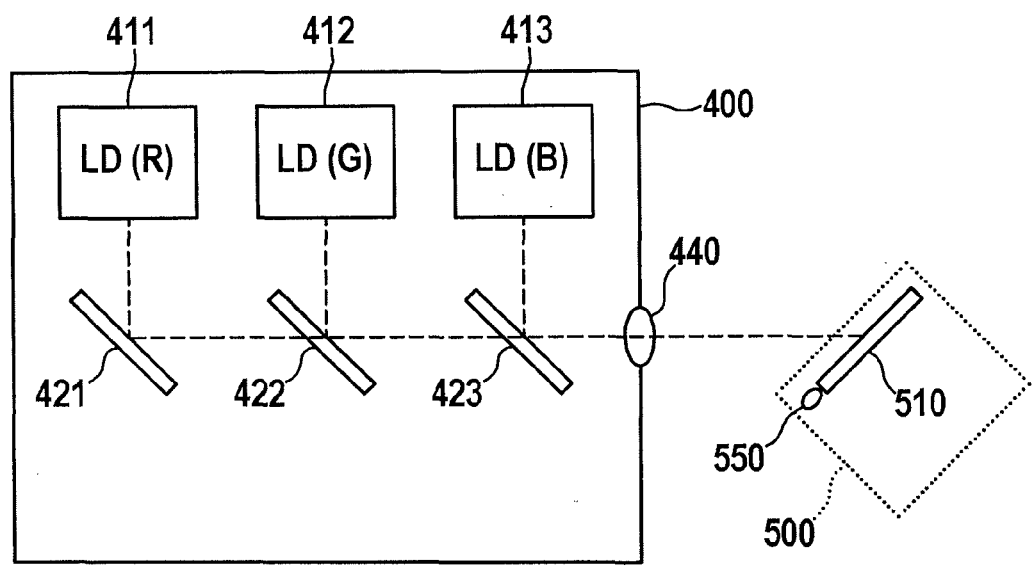
FIG. 2 shows a microprojector according to the present invention including a laser light source and including a micromechanical component which includes a micromirror and an integrated photodiode.

FIG. 2 shows a microprojector according to the present invention including a laser light source and including a micromechanical component which includes a micromirror and an integrated photodiode. A microprojector 200 is depicted including a light source 400 and including a micromechanical component 500. Light source 400 includes three laser diodes 411, 412, 413 whose emitted light in the form of three laser beams is combined into one beam with the aid of beam splitters 421, 422, 423. The combined beam emanates from light source 400 at aperture 440. Micromechanical component 500 includes a movable micromirror 510 and an integrated photodiode 550 according to the present invention. Micromechanical component 500 is situated in the optical path of light source 400 in such a way that the combined beam strikes micromirror 510 and may be deflected by it for displaying a projector image. Photodiode 550 is used as a shared detector for the radiant power of all three laser diodes. The present invention uses the installation space present in the micromechanical component (MEMS) for positioning photodiode 550. In the figure, a position of photodiode 550 next to micromirror 510 is schematically depicted. Scattered light from the primary beam appears in this area.

Figure 3:
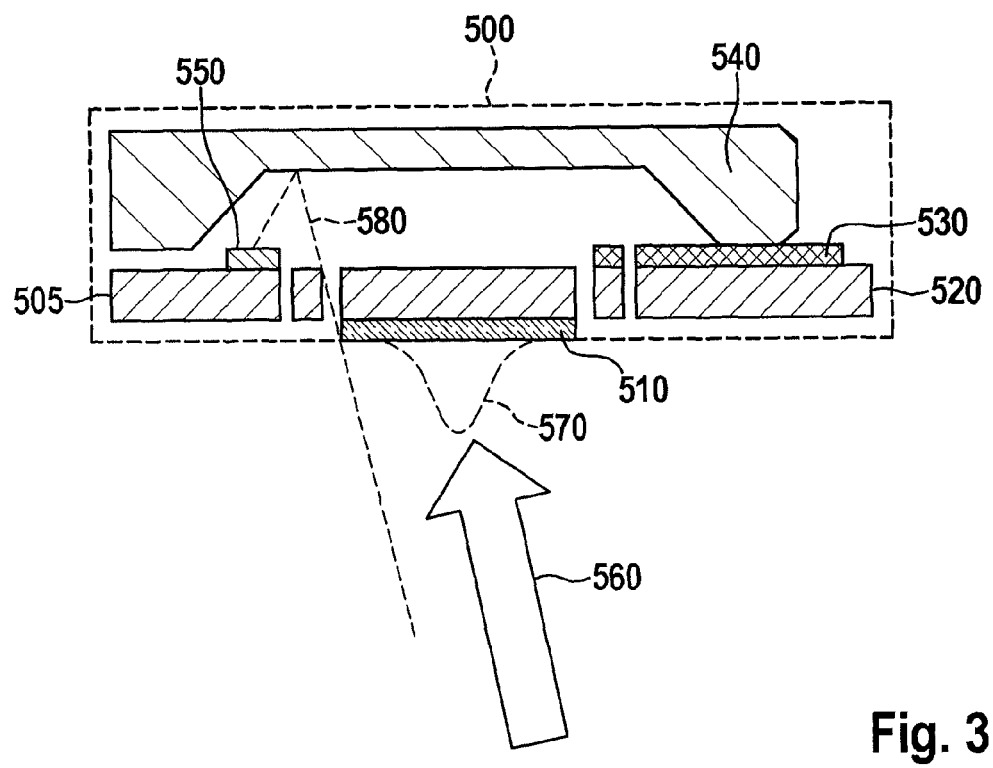
FIG. 3 shows a first exemplary embodiment of a micromechanical component according to the present invention including a micromirror and an integrated photodiode.

FIG. 3 shows a first exemplary embodiment of a micromechanical component according to the present invention including a micromirror and an integrated photodiode. A micromechanical component 500 is depicted including a substrate 505 and a cap 540. A micromirror 510 and a chip frame 530 are structured out of substrate 505. According to the present invention, a photodiode 550 is integrated into micromechanical component 500. Photodiode 550 is also situated on substrate 505. In this exemplary embodiment, one mirror face of micromirror 510 is situated on a first substrate side and a cap is situated on a second substrate side, the second substrate side being situated opposite the first substrate side, i.e., on the other side of the substrate as seen through the substrate. Photodiode 550 is situated on the second substrate side in an area covered by cap 540. Micromirror 510 and cap 540 are situated inside a shared incidence area for incident light 560, for example, in the form of a laser beam.

Photodiode 550 is configured in such a way that it is able to receive scattered light 580 which emanates from the cap. Micromirror 510 is movably suspended and connected to fixed chip frame 520 with the aid of a suspension system. Micromirror 510 has a contacting plane 530. Contacting plane 530 is used to connect a mirror drive and to configure it to be electrically contactable from outside. Contacting plane 530 is also used for positioning and contacting photodiode 550. Photodiode 550 is situated in contacting plane 530 or also in an adjacent plane and is connected to contacting plane 530. Micromechanical component 500 includes cap 540 for protection from external damage and dirt. Light 560 which is incident on micromirror 510, for example, a laser beam, has a Gauss profile 570 after the aperture, i.e., the intensity is concentrated on a core area and then drops exponentially toward the outside. Micromirror 510, which is movable about one or multiple axes of rotation, is positioned in such a way that it reflects the core area of the laser beam. However, a residual intensity is still present to the side of the mirror. This residual light 580 spreads out past the micromirror, strikes cap 540, is scattered by cap 540 and then strikes photodiode 550. The amount of the scattered light is a function of the component. The signal of the photodiode is therefore calibrated for each component when new.

The positioning of photodiode 550 shown and described in FIG. 3 is advantageous, since unused installation space is available in this area, electrical contacting is easily possible, and the manufacture of the diode may be easily integrated into the process sequence for manufacturing micromechanical component 500.

Figure 4:
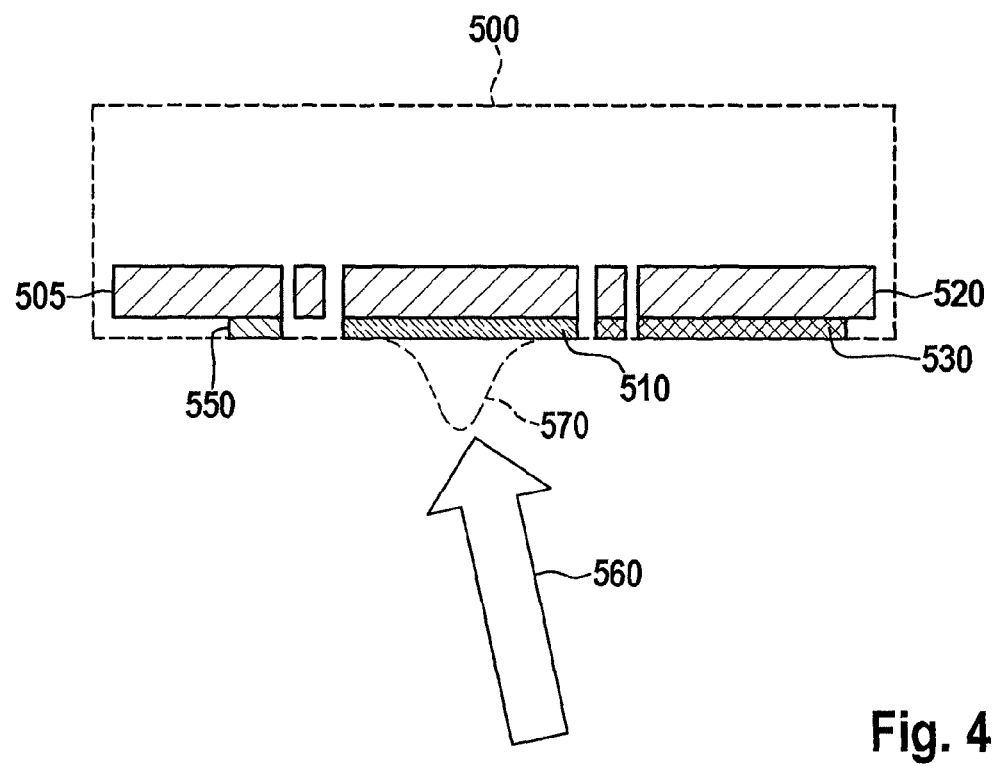
FIG. 4 shows a second exemplary embodiment of a micromechanical component according to the present invention including a micromirror and an integrated photodiode.

FIG. 4 shows a second exemplary embodiment of a micromechanical component according to the present invention including a micromirror and an integrated photodiode. A micromechanical component 500 is shown including a substrate 505. A micromirror 510 and a chip frame 530 are structured out of substrate 505. According to the present invention, a photodiode 550 is integrated into micromechanical component 500. Photodiode 550 is also situated on substrate 505. In this exemplary embodiment, one mirror face of micromirror 510 and photodiode 550 are situated on a first substrate side. A contacting plane 530 is also situated on the first substrate side, to which photodiode 550 is electrically connected, or in which photodiode 550 is also situated. In this specific embodiment, micromirror 510 and photodiode 550 are struck in equal measure by incident light 560, since they are situated within an incidence area for incident light. The maximum intensity falls on micromirror 510, and residual light from edge areas of the incident light beam strikes photodiode 550.

P-doping and n-doping are required for manufacturing a photodiode in a micromechanical (MEMS) component having a semiconductor substrate. A cost-neutral version of a photodiode integrated into the MEMS is possible if no additional process steps are required for its manufacture. In one specific embodiment of the present invention, this is possible if implantations are already used for semiconductor doping for other elements of the MEMS. Such elements are, for example, piezoresistors on suspension structures for suspending the micromirror. These piezoresistors are, for example, used to enable an electrical detection and subsequent control of the mirror position.

The present invention may be used in a laser projector or microprojector including one or multiple scanning micromirrors. Use in a laser printer including a scanning micromirror is also possible.

What is claimed is:

1. A micromechanical component, comprising:
   at least one micromirror; and
   an integrated photodiode,
   wherein the micromirror and the integrated photodiode are situated on a shared substrate, one mirror face of the micromirror is situated on a first substrate side and the photodiode is situated on the first substrate side in such a way that the micromirror and the photodiode are situated within a shared incidence area for incident light emitted by a light source as a combined beam formed of beams of a first laser and a second laser, such that the integrated photodiode is used as a shared detector for radiant power of both the first laser and the second laser.

2. A micromechanical component, comprising:
   at least one micromirror; and
   an integrated photodiode,
   wherein the micromirror and the integrated photodiode are situated on a shared substrate, one mirror face of the micromirror is situated on a first substrate side, a cap is situated on a second substrate side, the second substrate side being situated opposite the first substrate side, and wherein the photodiode is situated on the second substrate side in an area covered by the cap in such a way that the micromirror and the cap are situated within a shared incidence area for incident light, and wherein the photodiode receives scattered light which emanates from the cap.

3. The micromechanical component as recited in claim 2, wherein the substrate has a contacting plane and the photodiode is situated in one of the contacting plane or in an adjacent plane.

4. The micromechanical component as recited in claim 2, wherein the substrate has at least one doped semiconductor layer and the photodiode is situated in the doped semiconductor layer.

5. A microprojector, comprising:
   a light source that includes at least a first laser having a first wavelength and at least a second laser having a second wavelength; and
   a micromechanical component which includes at least one micromirror and an integrated photodiode for receiving light from the light source,
   wherein the micromirror and the photodiode are within a shared incidence area for incident light emitted by the light source as a combined beam formed of beams of the first laser and the second laser, such that the combined beam strikes the micromirror and is deflected by it for displaying a projector image, and the integrated photodiode is used as a shared detector for radiant power of both the first laser and the second laser.

6. The microprojector as recited in claim 5, wherein the light source is a laser light source including a semiconductor laser medium.

7. The microprojector as recited in claim 5, wherein the micromirror and the integrated photodiode are situated on a shared substrate, one mirror face of the micromirror is situated on a first substrate side and the photodiode is situated on the first substrate side.

8. A microprojector, comprising:
   a light source; and
   a micromechanical component which includes at least one micromirror and an integrated photodiode for receiving light from the light source,
   wherein the micromirror and the integrated photodiode are situated on a shared substrate, one mirror face of the micromirror is situated on a first substrate side, a cap is situated on a second substrate side, the second substrate side being situated opposite the first substrate side, and wherein the photodiode is situated on the second substrate side in an area covered by the cap in such a way that the micromirror and the cap are situated within a shared incidence area for incident light, and wherein the photodiode receives scattered light which emanates from the cap.

* * * * *